United States Patent
Chen et al.

(10) Patent No.: US 12,289,932 B2
(45) Date of Patent: Apr. 29, 2025

(54) METHOD FOR MASS TRANSFER OF MINI LIGHT-EMITTING DIODES (MINI-LEDS) USING SLIDING-ON-MEMBRANE PIN EJECTION

(71) Applicant: Guangdong University of Technology, Guangzhou (CN)

(72) Inventors: Yun Chen, Guangzhou (CN); Yanhui Chen, Guangzhou (CN); Li Ma, Guangzhou (CN); Hao Zhang, Guangzhou (CN); Jintao Chen, Guangzhou (CN); Maoxiang Hou, Guangzhou (CN); Xin Chen, Guangzhou (CN)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 18/769,413

(22) Filed: Jul. 11, 2024

(65) Prior Publication Data
US 2024/0363793 A1    Oct. 31, 2024

(30) Foreign Application Priority Data
Aug. 8, 2023    (CN) .......................... 202310998647.7

(51) Int. Cl.
*H10H 20/01*  (2025.01)
*H01L 21/67*  (2006.01)

(52) U.S. Cl.
CPC ....... *H10H 20/01* (2025.01); *H01L 21/67132* (2013.01); *H01L 21/67144* (2013.01)

(58) Field of Classification Search
CPC .............................. H10H 20/01; H01L 21/681
(Continued)

(56) References Cited

U.S. PATENT DOCUMENTS

2020/0219854 A1* 7/2020 Oh .......................... H10F 30/21
2021/0035837 A1* 2/2021 Huska ............... H01L 21/67706

FOREIGN PATENT DOCUMENTS

CN    113539935 A    10/2021
CN    113808987 A  * 12/2021
(Continued)

OTHER PUBLICATIONS

Chen Jin-tao et al., "Study on Motion Prompting System of Tele-Operated Construction Robot", Machinery Design & Manufacture, No. 6, Jun. 8, 2016, Line 5, left column, p. 158 to line 6, right column, p. 161.

(Continued)

*Primary Examiner* — Jay C Chang
*Assistant Examiner* — Mikka Liu

(57) ABSTRACT

An ejector pin sliding on membrane-based device and method for mass transfer of mini light-emitting diodes (Mini-LEDs) are provided. The device includes a gantry transverse beam. The gantry transverse beam is provided with an ejector pin base, and the ejector pin base is configured to move along the gantry transverse beam. The ejector pin base is fixedly provided with a vision camera and an ejector pin. A blue membrane is horizontally provided at a side of the gantry transverse beam close to the ejector pin, and is spaced from the gantry beam. A surface of a side of the blue membrane away from the gantry transverse beam is adhesively provided with a plurality of Mini-LED chips arranged evenly. A transfer substrate is horizontally provided at a side of the blue membrane close to the plurality of Mini-LED chips, and is spaced from the blue membrane.

1 Claim, 2 Drawing Sheets

(58) Field of Classification Search
USPC .......................................................... 438/22
See application file for complete search history.

(56) References Cited

FOREIGN PATENT DOCUMENTS

| | | |
|---|---|---|
| CN | 114512579 A | 5/2022 |
| CN | 116246988 A | 6/2023 |
| JP | 2001077598 A | 3/2001 |

OTHER PUBLICATIONS

Furong Chen et al., "Mass transfer techniques for large-scale and high-density microLED arrays", International Journal of Extreme Manufacturing, vol. 4, No. 4, Nov. 14, 2022, Line 3, left column, p. 2 to line 57, right column, p. 23.

* cited by examiner

METHOD FOR MASS TRANSFER OF MINI LIGHT-EMITTING DIODES (MINI-LEDS) USING SLIDING-ON-MEMBRANE PIN EJECTION

CROSS-REFERENCE TO RELATED APPLICATIONS

This application claims the benefit of priority from Chinese Patent Application No. 202310998647.7, filed on Aug. 8, 2023. The content of the aforementioned application, including any intervening amendments thereto, is incorporated herein by reference in its entirety.

TECHNICAL FIELD

This application relates to chip transfer and packaging technologies, and more particularly to an ejector pin sliding on membrane-based device and method for mass transfer of mini light-emitting diodes (Mini-LEDs).

BACKGROUND

The existing pin-ejector transfer techniques of Mini/Micro LED chips mainly includes an intermittent pin-ejector transfer approach and a continuous pin-ejector transfer approach.
(1) Intermittent Pin-Ejector Transfer A chip and a circuit board are vertically distributed under the cooperation of an upper motion platform and a lower motion platform, and after aligning the chip with the circuit board through the coordination of a charge-coupled device (CCD) and the upper and lower motion platforms, the chip is transferred from a chip carrier to the circuit board through an ejector pin to complete the transfer and packaging process. For the traditional ejector pin mechanisms, the ejector pin can only move up and down, and thus if the chip and the circuit board need to be accurately aligned, the upper and lower motion platforms need to pause intermittently for pin ejection, and then transfer the next chip. Such process greatly limits the transfer efficiency, and the repeated start and stop of the motion platform will inevitably affect the service life of the motion platform. Moreover, the shake generated by starting and pausing will greatly reduce the packaging precision.
(2) Continuous Pin-Ejector Transfer Based on the intermittent pin-ejector transfer technology, this technology avoids intermittent pause of the motion platform by controlling the ejector pin base to maintain a uniform movement in the whole process, at the same time, this technology can improve the transfer efficiency. In order to ensure the accuracy of the pin ejection, a voice coil motor and a flexible mechanism are used to control the ejector pin to move in a direction opposite to a movement direction of the ejector pin base while controlling the ejector pin to move downward in a Z-axis direction, so that the ejector pin, the chip and the circuit board remain relatively stationary, thereby improving the transfer accuracy.

Compared with the intermittent pin-ejector transfer technology, the continuous pin-ejector transfer technology has an improved transfer efficiency. However, in such two methods, the ejector pin moves vertically. Therefore, in view of the defects in the continuous pin-ejector transfer technology, it is urgent to optimize the vertical pin ejection of the prior art into a sliding-on-membrane pin ejection technology.

SUMMARY

This application provides an ejector pin sliding on membrane-based device and method for mass transfer of mini light-emitting diodes (Mini-LEDs), aiming to solve defects in the peeling-off form of the continuous pin-ejector transfer technology in the prior art, and greatly improve the peeling-off efficiency of Mini-LED chips.

In a first aspect, this application provides an ejector pin sliding on membrane-based device for mass transfer of mini light-emitting diode (Mini-LED), comprising:
a gantry transverse beam;
wherein the gantry transverse beam is provided with an ejector pin base, and the ejector pin base is configured to move along the gantry transverse beam; the ejector pin base is fixedly provided with a vision camera and an ejector pin; a blue membrane is horizontally provided at a side of the gantry transverse beam close to the ejector pin, and is spaced from the gantry transverse beam; a surface of a side of the blue membrane away from the gantry transverse beam is adhesively provided with a plurality of Mini-LED chips arranged evenly; and a transfer substrate is horizontally provided at a side of the blue membrane close to the plurality of Mini-LED chips, and is spaced from the blue membrane.

In an embodiment, the transfer substrate is a glass substrate or a printed circuit board (PCB) substrate.

In an embodiment, in a case that the transfer substrate is the glass substrate, a surface of a side of the transfer substrate close to the blue membrane is provided with a double-sided adhesive tape; and in a case that the transfer substrate is the PCB substrate, the surface of the side of the transfer substrate close to the blue membrane is provided with a solder paste.

In an embodiment, a thickness of the blue membrane is 70-75 μm.

In an embodiment, a geometric size of each of the plurality of Mini-LED chips is 50-200 μm.

In an embodiment, the ejector pin base is configured to be driven by a linear motor to move in an X-axis direction on the gantry transverse beam; and the gantry transverse beam is configured to move in a Y-axis direction through a stepper motor.

In an embodiment, the ejector pin base is configured to control the ejector pin to move in the X-axis direction and a Z-axis direction through a voice coil motor.

In an embodiment, a movement velocity of the ejector pin along a negative X-axis direction is less than a movement velocity of the ejector pin base along a positive X-axis direction.

In a second aspect, this application provides a method for mass transfer of Mini-LED using the device above, comprising:
(S1) placing horizontally and fixing the blue membrane to which the plurality of Mini-LED chips are bonded; and placing horizontally and fixing the transfer substrate on the side of the blue membrane close to the plurality of Mini-LED chips;
(S2) detecting and adjusting a height of the transfer substrate and a height of the blue membrane through the vision camera fixed on the ejector pin base; wherein the vision camera is configured to identify positions of the plurality of Mini-LED chips through the blue membrane; and controlling the gantry transverse beam to move in the Y-axis direction, and controlling the ejector pin base to move in the X-axis direction, so as to drive the vision camera to position the plurality of Mini-LED chips;

(S3) after completing the positioning of the plurality of Mini-LED chips by the vision camera, performing sliding-on-membrane pin ejection for Mini-LED chips among the plurality of Mini-LED chips in a first row along the X-axis direction; wherein the ejector pin is driven by the ejector pin base to perform uniform movement in the positive X-axis direction along the gantry transverse beam; when the ejector pin arrives at a position which is away from a first Mini-LED chip in the first row at a preset distance, the ejector pin is controlled by the ejector pin base to move along the negative X-axis direction at a certain velocity to reduce a velocity of the ejector pin such that the ejector pin is stopped at the first Mini-LED chip in the first row to perform the sliding-on-membrane pin ejection, and at the same time, the ejector pin is controlled by the ejector pin base to move along a negative Z-axis direction to drive the blue membrane and the first Mini-LED chip in the first row to fall; during a falling process, the blue membrane is deformed, and an adhesive layer between the blue membrane and the first Mini-LED chip in the first row is torn from an edge of the first Mini-LED chip in the first row; and upon being in contact with the transfer substrate, the first Mini-LED chip in the first row is peeled off from the blue membrane under the action of an adhesion of the transfer substrate to realize the sliding-on-membrane pin ejection; and after the sliding-on-membrane pin ejection on the first Mini-LED chip in the first row is completed, stopping controlling the ejector pin to move along the negative X-axis direction, and then performing sliding-on-membrane pin ejection on a second Mini-LED chip in the first row, and so on, until sliding-on-membrane pin ejection of the Mini-LED chips in the first row is completed; wherein the velocity of the ejector pin along the negative X-axis direction is less than the movement velocity of the ejector pin base along the positive X-axis direction; and (S4) after completing the sliding-on-membrane pin ejection of the Mini-LED chips in the first row, controlling the gantry transverse beam to move in the Y-axis direction to allow the ejector pin to be aligned with a first Mini-LED chip in a second row among the plurality of Mini-LED chips based on identification of the vision camera; repeating step (S3) to perform pin ejection and transfer until pin ejection of the plurality of Mini-LED chips is completed.

Compared to the prior art, the present disclosure has the following beneficial effects.

Compared with the pin ejection of the prior art, the sliding-on-membrane pin ejection avoids frequent intermittent pause of a motion platform based on a transverse uniform movement during the sliding-on-membrane pin ejection, and reduces the wear and tear of the motion platform. Compared with the continuous pin-ejector transfer, the sliding-on-membrane pin ejection has a longer contact time on a surface of the blue membrane, which is conducive to tearing and expanding cracks in an adhesive layer between the blue membrane and each of the plurality of Mini-LED chips, improving the pin ejection efficiency and transfer quality.

BRIEF DESCRIPTION OF THE DRAWINGS

The present disclosure will be described in detail below with reference to the accompanying drawings and embodiments to make technical solutions and advantages of the present disclosure clearer and readily understandable.

Figure 1:
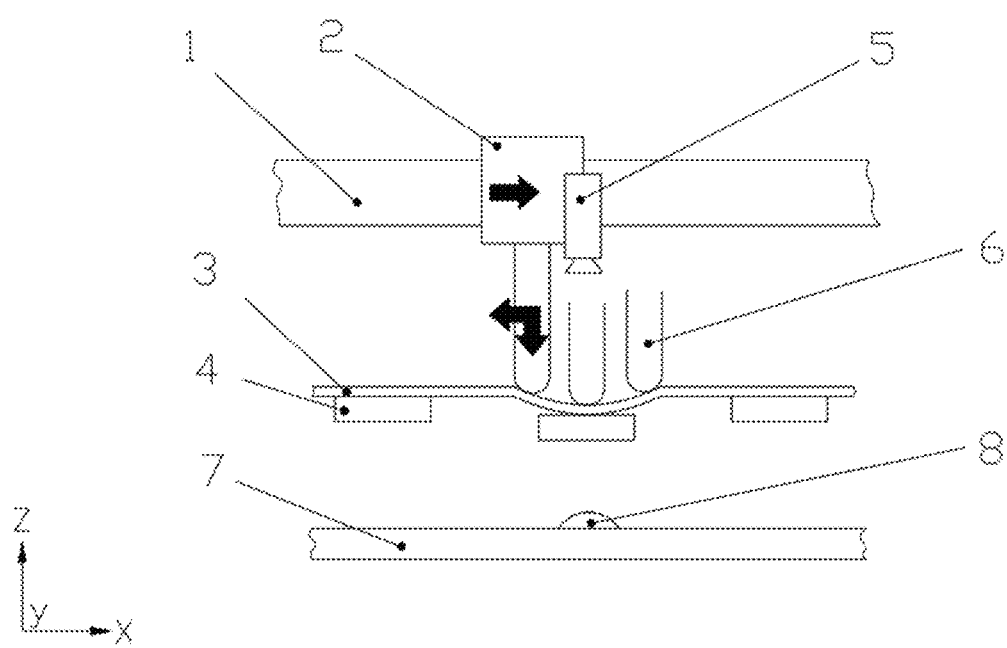
FIG. 1 is a structural diagram of a device for mass transfer of mini light-emitting diode (Mini-LED) according to an embodiment of the present disclosure.

In the figures: gantry transverse beam 1; ejector pin base 2; blue membrane 3; Mini-LED chip 4; vision camera 5; ejector pin 6; transfer substrate 7; and solder paste 8.

DETAILED DESCRIPTION OF EMBODIMENTS

The embodiments of the present disclosure will be detailedly described below with reference to the accompanying drawings.

Described herein are several specific embodiments of the present disclosure, which are only for the purpose of explanation and illustration, and are not intended to limit the disclosure. Those skilled in the art can still make various variations, modifications and replacements to the technical solutions in the embodiments described herein. It should be understood that those variations, modifications and replacements made without departing from the spirit of the disclosure shall fall within the scope of this application defined by the appended claims.

Embodiment 1

A device for mass transfer of mini light-emitting diodes (Mini-LEDs) is provided herein, which is structurally shown in FIG. 1. The device includes a gantry transverse beam 1. The gantry transverse beam 1 is provided with an ejector pin base 2, and the ejector pin base 2 is configured to move along the gantry transverse beam 1. The ejector pin base 2 is fixedly provided with a vision camera 5 and an ejector pin 6. A blue membrane 3 is horizontally provided at a side of the gantry transverse beam 1 close to the ejector pin 6, and is spaced from the gantry transverse beam 1. A surface of a side of the blue membrane 3 away from the gantry transverse beam 1 is adhesively provided with a plurality of Mini-LED chips 4 arranged evenly. A transfer substrate 7 is horizontally provided at a side of the blue membrane 3 close to the plurality of Mini-LED chips 4, and is spaced from the blue membrane 3.

In an embodiment, the transfer substrate 7 is a glass substrate or a printed circuit board (PCB) substrate.

In an embodiment, in a case that the transfer substrate 7 is the glass substrate, a surface of a side of the transfer substrate 7 close to the blue membrane 3 is provided with a double-sided adhesive tape, and in a case that the transfer substrate 7 is the PCB substrate, the surface of the side of the transfer substrate 7 close to the blue membrane 3 is provided with a solder paste 8.

In an embodiment, a thickness of the blue membrane 3 is 70-75 μm.

In an embodiment, each of the plurality of Mini-LED chips 4 has a length and a width of 50-200 μm.

In an embodiment, the ejector pin base 2 is configured to be driven by a linear motor to move in an X-axis direction on the gantry transverse beam 1, the gantry transverse beam 1 is configured to move in a Y-axis direction through a stepper motor, which avoids frequent intermittent pause of a motion platform, and reduces a loss of the motion platform.

In an embodiment, the ejector pin base 2 is configured to control the ejector pin 6 to move in the X-axis direction and a Z-axis direction through a voice coil motor, so as to avoid the frequent intermittent pause of the motion platform, and reduce the wear of the motion platform.

In an embodiment, a movement velocity of the ejector pin 6 along a negative X-axis direction is less than a movement velocity of the ejector pin base 2 along a positive X-axis direction, which effectively improve reliability of the ejector pin 6 and the ejector pin base 2.

In an embodiment, the vision camera 5 is configured to identify position information of the blue membrane 3, the plurality of Mini-LED chips 4 and the transfer substrate 7 for subsequent adjustment. By controlling the gantry transverse beam 1 to move in the Y-axis direction, the ejector pin base 2 is configured to move in the X-axis direction, so as to drive the vison camera 5 to position the plurality of Mini-LED chips 4.

Embodiment 2

Figure 2:
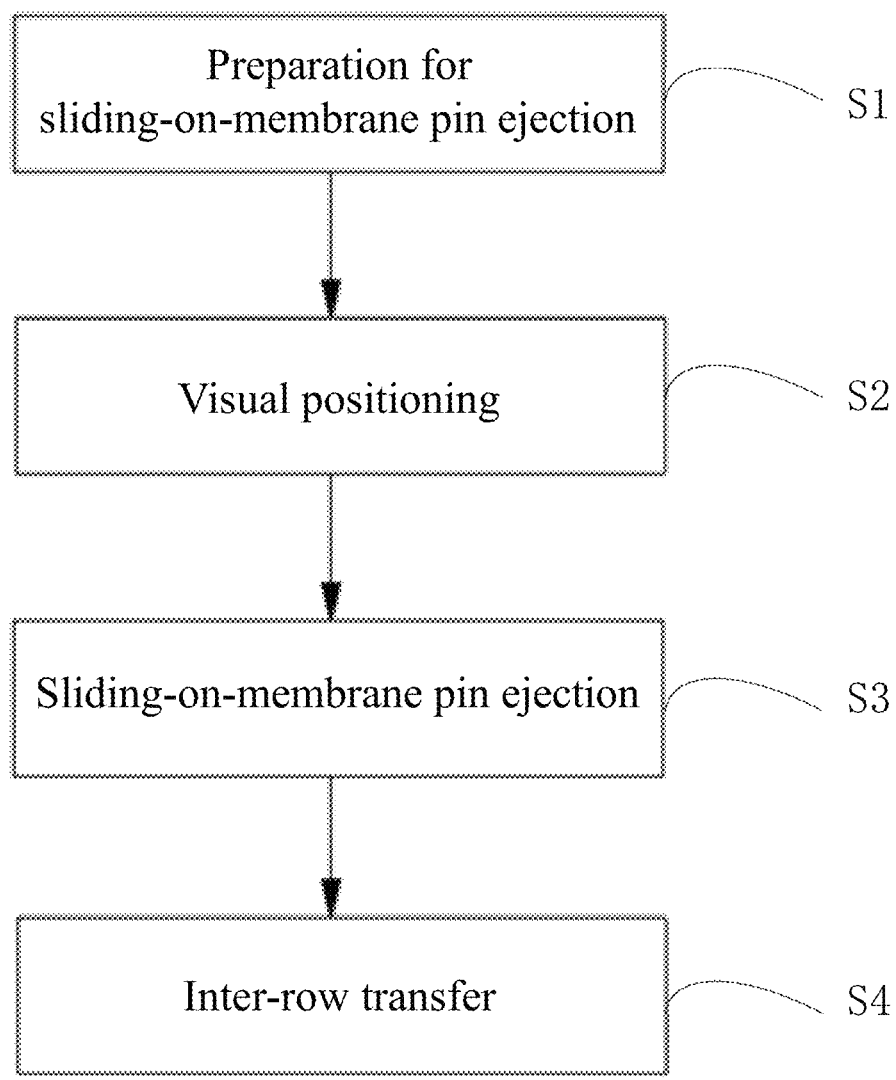
FIG. 2 is a flow chart diagram of a method for mass transfer of Mini-LED using the device according to an embodiment of the present disclosure.

FIG. 2 is a flow chart of a method for mass transfer of Mini-LEDs using the above device, which includes the following steps.

(S1) The blue membrane 3 to which the plurality of Mini-LED chips 4 are bonded is placed horizontally and fixed. The transfer substrate 7 is placed horizontally and fixed on the side of the blue membrane 3 close to the plurality of Mini-LED chips 4.

(S2) A height of the transfer substrate 7 and a height of the blue membrane 3 are detected and adjusted through the vision camera 5 fixed on the ejector pin base 2. The vision camera 5 is configured to identify positions of the plurality of Mini-LED chips 4 through the blue membrane 3. The gantry transverse beam 1 is controlled to move in the Y-axis direction, and the ejector pin base 2 is controlled to move in the X-axis direction, so as to drive the vision camera 5 to position the plurality of Mini-LED chips 4.

(S3) After completing the positioning of the plurality of Mini-LED chips 4 by the vision camera 5, sliding-on-membrane pin ejection is performed along the X-axis direction for Mini-LED chips 4 in a first row. The ejector pin 6 is driven by the ejector pin base 2 to perform uniform movement in the positive X-axis direction along the gantry transverse beam 1. When the ejector pin 6 arrives at a position which is away from a first Mini-LED chip 4 in the first row at a preset distance, the ejector pin 6 is controlled by the ejector pin base 2 to move along the negative X-axis direction at a certain velocity to reduce a velocity of the ejector pin 6 such that the ejector pin 6 is stopped at the first Mini-LED chip 4 in the first row to perform the sliding-on-membrane pin ejection, and at the same time, the ejector pin 6 is controlled by the ejector pin base 2 to move along a negative Z-axis direction to drive the blue membrane 3 and the first Mini-LED chip 4 in the first row to fall. During a falling process, the blue membrane 3 is deformed, and an adhesive layer between the blue membrane 3 and the first Mini-LED chip 4 in the first row is torn from an edge of the first Mini-LED chip 4 in the first row. Upon being in contact with the transfer substrate 7, the first Mini-LED chip 4 in the first row is peeled off from the blue membrane 3 under the action of an adhesion of the transfer substrate 7 to realize the sliding-on-membrane pin ejection. After the sliding-on-membrane pin ejection for the first Mini-LED chip 4 in the first row is completed, the ejector pin 6 is stopped from being controlled to move along the negative X-axis direction, and then sliding-on-membrane pin ejection is performed on a second Mini-LED chip 4 in the first row, and so on, until sliding-on-membrane pin ejection of the Mini-LED chips 4 in the first row is completed.

(S4) after completing the sliding-on-membrane pin ejection of the Mini-LED chips 4 in the first row, the gantry transverse beam 1 is controlled to move in the Y-axis direction to allow the ejector pin 6 to be aligned with a first Mini-LED chip 4 in a second row among the plurality of Mini-LED chips 4 based on identification of the vision camera 5. Step (S3) is repeated to perform the sliding-on-membrane pin ejection and transfer until the sliding-on-membrane pin ejection of the plurality of Mini-LED chips 4 is completed.

Compared to the prior art, the present disclosure has the following beneficial effects.

Compared with the pin ejection in the prior art, the sliding-on-membrane pin ejection avoids frequent intermittent pause of a motion platform based on the transverse uniform movement during the sliding-on-membrane pin ejection, and reduces a loss of the motion platform. Compared with the existing continuous pin-ejector transfer, the sliding-on-membrane pin ejection has a longer contact with surface of the blue membrane, which is conducive to tearing and expanding cracks in an adhesive layer between the blue membrane and each of the plurality of Mini-LED chips, improving the pin ejection efficiency and transfer quality.

Described above are only preferred embodiments of the present disclosure, which are not intended to limit the disclosure. It should be understood that various replacements, variations and modifications made without departing from the spirit of the present disclosure shall fall within the scope of the disclosure defined by the appended claims.

What is claimed is:

1. A method for mass transfer of a mini light-emitting diode (Mini-LED), comprising:
    (S1) placing horizontally and fixing a blue membrane to which a plurality of Mini-LED chips are bonded; and placing horizontally and fixing a transfer substrate on a side of the blue membrane close to the plurality of Mini-LED chips;
    (S2) detecting and adjusting, by a vision camera fixed on an ejector pin base, a height of the transfer substrate and a height of the blue membrane; wherein the vision camera is configured to identify positions of the plurality of Mini-LED chips through the blue membrane; and controlling a gantry transverse beam to move in a Y-axis direction, and controlling the ejector pin base to move in an X-axis direction, so as to drive the vision camera to position the plurality of Mini-LED chips;
    (S3) after completing the positioning of the plurality of Mini-LED chips by the vision camera, performing a sliding-on-membrane pin ejection for Mini-LED chips among the plurality of Mini-LED chips in a first row along the X-axis direction; wherein an ejector pin is driven by the ejector pin base to perform a uniform movement in a positive X-axis direction along the gantry transverse beam; when the ejector pin arrives at a position which is away from a first Mini-LED chip in the first row at a preset distance, the ejector pin is controlled by the ejector pin base to move along a negative X-axis direction at a certain velocity to reduce a velocity of the ejector pin such that the ejector pin is stopped at the first Mini-LED chip in the first row to perform the sliding-on-membrane pin ejection, and at the same time, the ejector pin is controlled by the ejector pin base to move along a negative Z-axis direction to drive the blue membrane and the first Mini-LED chip in the first row to fall; during a falling process, the blue membrane is deformed, and an adhesive layer between the blue membrane and the first Mini-LED chip in the first row is torn from an edge of the first Mini-LED chip in the first row; and upon being in contact with the transfer substrate, the first Mini-LED chip in the first row is peeled off from the blue membrane under an action of an adhesion of the transfer substrate to realize the sliding-on-membrane pin ejection; and after the sliding-on-membrane pin ejection on the first Mini-LED chip in the first row is completed, stopping controlling the ejector pin to move along the negative X-axis direction, and then performing the sliding-on-membrane pin ejection on a second Mini-LED chip in the first row, and so on, until the sliding-on-membrane pin ejection of the Mini-LED chips in the first row is completed; wherein the velocity of the ejector pin along the negative X-axis direction is less than a movement velocity of the ejector pin base along the positive X-axis direction; and (S4) after completing the sliding-on-membrane pin ejection of the Mini-LED chips in the first row, controlling the gantry transverse beam to move in the Y-axis direction to allow the ejector pin to be aligned with a first Mini-LED chip in a second row among the plurality of Mini-LED chips based on identification of the vision camera; repeating step (S3) to perform the sliding-on-membrane pin ejection and transfer until the sliding-on-membrane pin ejection of the plurality of Mini-LED chips is completed.

* * * * *